US012799578B2

(12) United States Patent
Song et al.

(10) Patent No.: US 12,799,578 B2
(45) Date of Patent: Nov. 17, 2026

(54) MASK ASSEMBLY AND DEPOSITION DEVICE INCLUDING THE SAME

(71) Applicant: Samsung Display Co., LTD., Yongin-si (KR)

(72) Inventors: Minchul Song, Yongin-si (KR); Mingoo Kang, Yongin-si (KR); Junhyeuk Ko, Yongin-si (KR); Jongsung Park, Yongin-si (KR); Sukha Ryu, Yongin-si (KR); Seungju Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 593 days.

(21) Appl. No.: 18/468,172

(22) Filed: Sep. 15, 2023

(65) Prior Publication Data

US 2024/0093346 A1 Mar. 21, 2024

(30) Foreign Application Priority Data

Sep. 19, 2022 (KR) ........................ 10-2022-0118204

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
None
See application file for complete search history.

(56) References Cited

U.S. PATENT DOCUMENTS

| | | | | |
|---|---|---|---|---|
| 3,241,519 | A * | 3/1966 | Lloyd | C23C 14/042 118/504 |
| 7,396,558 | B2 * | 7/2008 | Fujimori | H10K 71/166 118/721 |
| 9,663,855 | B2 * | 5/2017 | Lee | C23C 16/5096 |
| 2012/0325143 | A1 * | 12/2012 | Kang | C23C 14/042 118/504 |
| 2016/0372715 | A1 * | 12/2016 | Seo | H01J 37/32366 |
| 2024/0093346 | A1 * | 3/2024 | Song | C23C 14/042 |

FOREIGN PATENT DOCUMENTS

| | | | | |
|---|---|---|---|---|
| EP | 3617341 A2 * | 3/2020 | C23C 14/042 |
| JP | 4439203 B2 * | 3/2010 | |
| JP | 4795842 B2 * | 10/2011 | |
| JP | 6526880 B1 * | 6/2019 | C23C 14/243 |
| KR | 10-2016-0033337 | 3/2016 | |
| KR | 10-2016-0033338 | 3/2016 | |
| KR | 10-2018-0038093 | 4/2018 | |
| KR | 10-2022-0048499 | 4/2022 | |
| KR | 102505877 B1 * | 3/2023 | H10K 71/166 |
| WO | WO-2008047458 A1 * | 4/2008 | H10P 72/7616 |
| WO | WO-2013108823 A1 * | 7/2013 | C23C 14/042 |

OTHER PUBLICATIONS

Machine Generated English Translation of KR20180038093 also known as KR10-2018-0038093. Held to Park Jon Song et al. Published Apr. 16, 2018. (Year: 2018).*

* cited by examiner

*Primary Examiner* — Sylvia Macarthur
(74) *Attorney, Agent, or Firm* — CANTOR COLBURN LLP

(57) ABSTRACT

A mask assembly includes a mask, a frame having an external portion surrounding an opening, a mask fixing portion including a long-side stick and a short-side stick for fixing the mask, and a height correcting member connecting the mask fixing portion and the external portion of the frame.

20 Claims, 14 Drawing Sheets

MASK ASSEMBLY AND DEPOSITION DEVICE INCLUDING THE SAME

CROSS-REFERENCE TO RELATED APPLICATION(S)

This application claims priority to and the benefits of Korean Patent Application No. 10-2022-0118204 under 35 U.S.C. § 119, filed on Sep. 19, 2022, in the Korean Intellectual Property Office (KIPO), the entire contents of which are incorporated herein by reference.

BACKGROUND

1. Technical Field

The disclosure relates to a mask assembly and a vertical deposition device including the same.

2. Description of the Related Art

An emissive display device is a self-emissive display diode with merits of a wide viewing angle, outstanding contrast, and a fast response time so it attracts public attention as a next-generation display element.

A mask may be used when a display device is manufactured. Openings are defined in the mask, and constituent elements of the display device may be deposited on a substrate through the openings. For example, when the display device includes a light-emitting device, an organic material for manufacturing an emission layer of the light-emitting device may be deposited on the substrate through the openings of the mask. An organic material for manufacturing a color filter may be deposited on the substrate through the openings of the mask.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a mask assembly and a deposition device for removing deposition defects caused by deformation of a long side and a short side of a frame of a mask assembly.

According to an embodiment, a mask assembly may include a mask, a frame having an external portion surrounding an opening, a mask fixing portion including a long-side stick and a short-side stick for fixing the mask, and a height correcting member connecting the mask fixing portion and the external portion of the frame.

The height correcting member may include a first height correcting member and a second height correcting member, and the first height correcting member and the second height correcting member may have different heights.

The height correcting member may include a metal.

The frame may have a groove on the external portion, and the height correcting member may be positioned in the groove.

The height correcting member may be fixed to the external portion of the frame by a first fixing member.

The height correcting member and the mask fixing portion may be fixed by a second fixing member.

The mask fixing portion may be fixed to the external portion of the frame by the second fixing member.

The mask fixing portion may be bent adjacent to the height correcting member.

According to an embodiment, a deposition device may include a deposition source providing a deposition material, and a deposition unit including a substrate receiving the deposition material. The deposition unit may include a mask facing the substrate, a frame having an external portion surrounding an opening, a mask fixing portion including a long-side stick and a short-side stick for fixing the mask, and a height correcting member connecting an end of the mask fixing portion and the external portion of the frame.

The height correcting member may include a first height correcting member and a second height correcting member, and the first height correcting member and the second height correcting member may have different heights.

The height correcting member may include a metal.

The frame may have a groove on the external portion, and the height correcting member may be positioned in the groove.

The height correcting member may be fixed to the external portion of the frame by a first fixing member.

The height correcting member may be fixed to the mask fixing portion by a second fixing member.

The mask fixing portion may be fixed to the external portion of the frame by the second fixing member.

The mask fixing portion may be bent adjacent to the height correcting member.

The deposition unit may further include a fixing plate for fixing the substrate, the mask may be positioned on a side of the substrate, and another side of the substrate may be fixed to the fixing plate.

The deposition device may be arranged vertically with respect to gravity.

The deposition unit may be inclined with respect to gravity with an angle in a range of about 4 degrees to about 14 degrees.

The deposition source may include a vaporizer vaporizing the deposition material, a pipe connected to the vaporizer, and a nozzle extending vertically with respect to gravity.

According to an embodiment, the height correcting member may be disposed between the frame and the mask fixing portion so the mask may be disposed on the substrate with a regular distance in case that the mask fixing portion is deformed and no deposition defects may be generated.

DETAILED DESCRIPTION OF THE EMBODIMENTS

Figure 1:
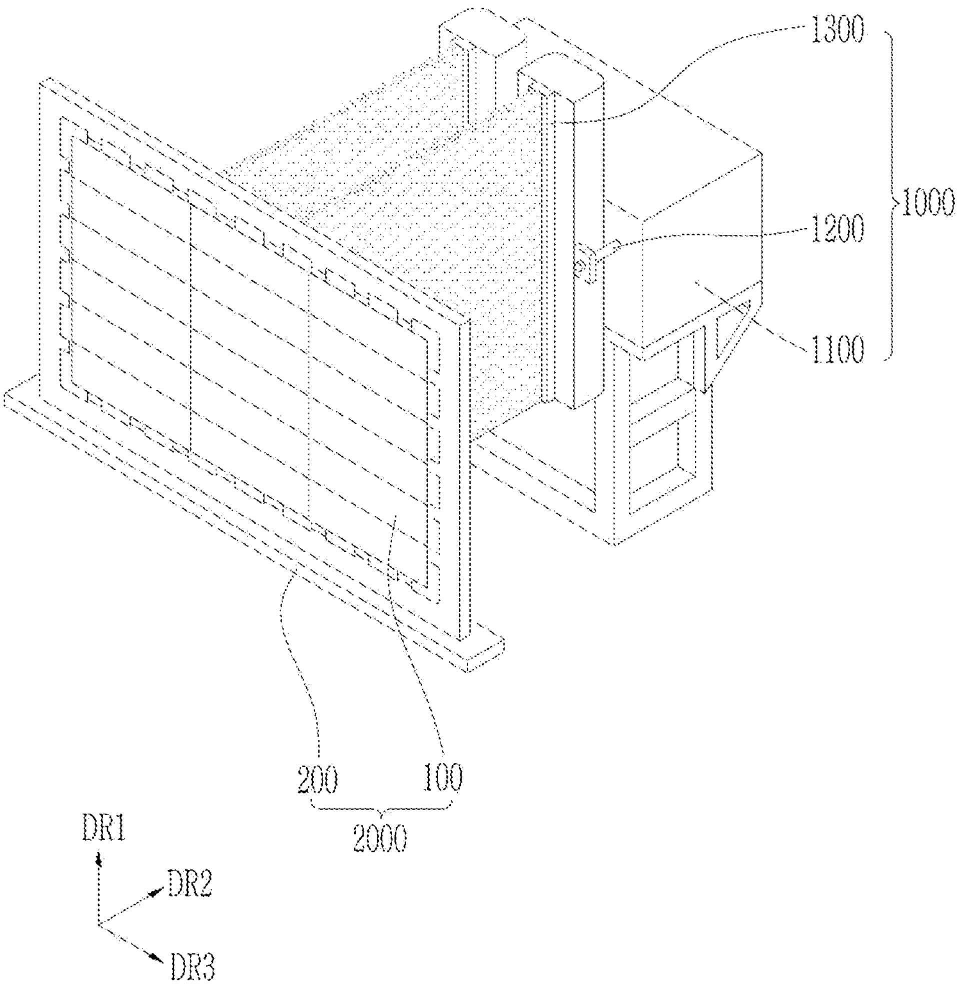
FIG. 1 is a perspective view illustrating a structure of a deposition device according to an embodiment.

The embodiments will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the embodiments, and the same elements will be designated by the same reference numerals throughout the specification.

The size and thickness of each configuration shown in the drawings are arbitrarily shown for better understanding and ease of description, but the disclosure is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing an object portion from the top, and the phrase "in a cross-sectional view" means viewing a cross-section of which the object portion is vertically cut from the side.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

When the parts such as wires, layers, films, regions, plates, or constituent elements are described to extend in the "first direction or the second direction", this not only signifies a straight-line shape running straight in a corresponding direction, but also includes a structure generally extending in the first direction or the second direction, a structure bent on a portion, a zigzag-shaped structure, or a structure including a curved structure and extending.

Electronic devices (e.g., mobile phones, TVs, monitors, laptop computers, etc.,) including the display device and the display panel described in the specification or the electronic devices including the display device and the display panel manufactured by a manufacturing method described in the specification are not excluded from the claimed range of the specification.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A deposition device according to an embodiment will now be described in detail with reference to accompanying drawings.

FIG. 1 is a perspective view illustrating a structure of a deposition device according to an embodiment.

Referring to FIG. 1, the deposition device may be a vertical deposition device. The vertical deposition device may be contrasted to a horizontal deposition device, and it may be a device in which the substrate on which a deposition is performed is not positioned in parallel to a surface of the earth but is positioned vertically. In the specification, a direction that is perpendicular to the surface of the earth will be referred to as a first direction DR1, and directions that are parallel to the surface of the earth will be referred to as a second direction DR2 and a third direction DR3.

FIG. 1 shows a deposition device including a deposition source 1000 and a deposition unit 2000.

The deposition source 1000 may include a vaporizer 1100 for vaporizing a deposition material and a pipe 1200 connected to the vaporizer 1100. A material vaporized by the vaporizer 1100 may be transmitted to a nozzle 1300 through the pipe 1200. The nozzle 1300 may extend in the first direction DR1, and may spray the deposition material in the second direction DR2. The sprayed deposition material may be deposited on the substrate 100 of the deposition unit 2000. The deposition material may be an organic material or an inorganic material.

The deposition unit 2000 may include a frame 200, and the substrate 100 may be attached to the frame 200.

Referring to FIG. 1, the deposition unit 2000 may be positioned vertically with respect to the surface of the earth. The deposition unit 2000 may extend in the first direction DR1. The vertical deposition device may minimize drooping of the substrate 100 generated by the horizontal deposition device, and a distortion of a pixel per accuracy (PPA) caused by the drooping. For example, during manufacturing a display device using a wide mother substrate, the wide mother substrate may be drooped in the horizontal deposition device so the pixel per accuracy (PPA) may be lowered. The pixel per accuracy (PPA) may be a degree of a material that is accurately deposited on the corresponding pixel, and may indicate a matching degree of a pattern of a mask a pattern actually formed on a target. The lowering of the pixel per accuracy may be generated by a misalignment of the mask, and thermal deformation and mechanical deformation of the mask during a process. For example, the deposition may be performed in a vacuum chamber, and the mechanical deformation may be generated by vacuum. For example, a thermal deformation may be generated because of a high temperature used during the deposition process. In the specification, the pixel per accuracy (PPA) may be obtained by connecting shapes of the respective deposited pixels, and comparing the shapes of the pixels before/after they are deposited.

According to an embodiment, the deposition unit 2000 may be inclined in a direction to the deposition source 1000 by an angle, which will be described with reference to FIG. 12.

Referring to FIG. 1, the deposition unit 2000 may include the frame 200 and the substrate 100 fixed to the frame 200. A detailed configuration of the deposition unit 2000 will be described in detail with reference to FIG. 2 and FIG. 3.

Figure 2:
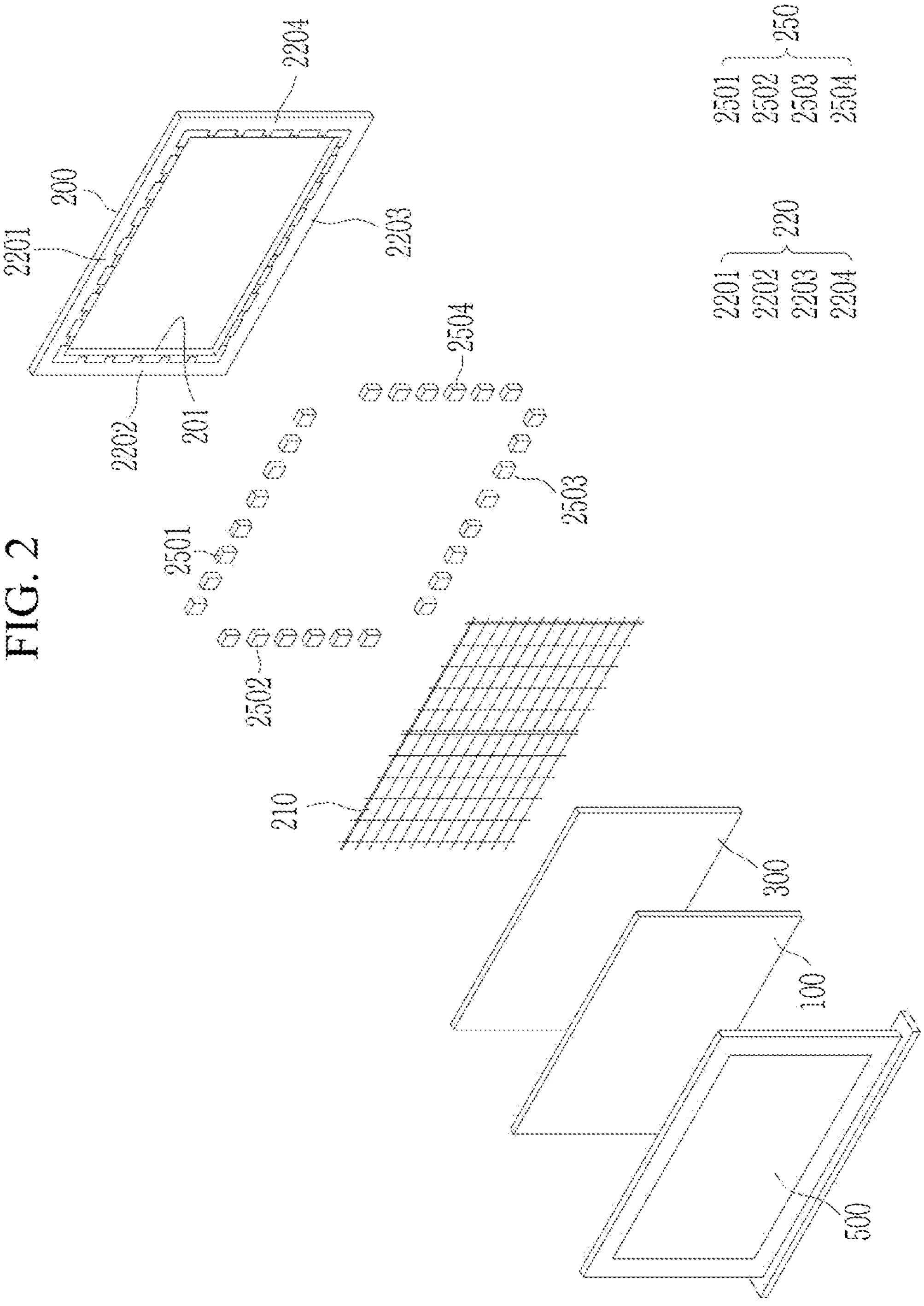
FIG. 2 is an exploded perspective view illustrating elements of a deposition unit.
Figure 3:
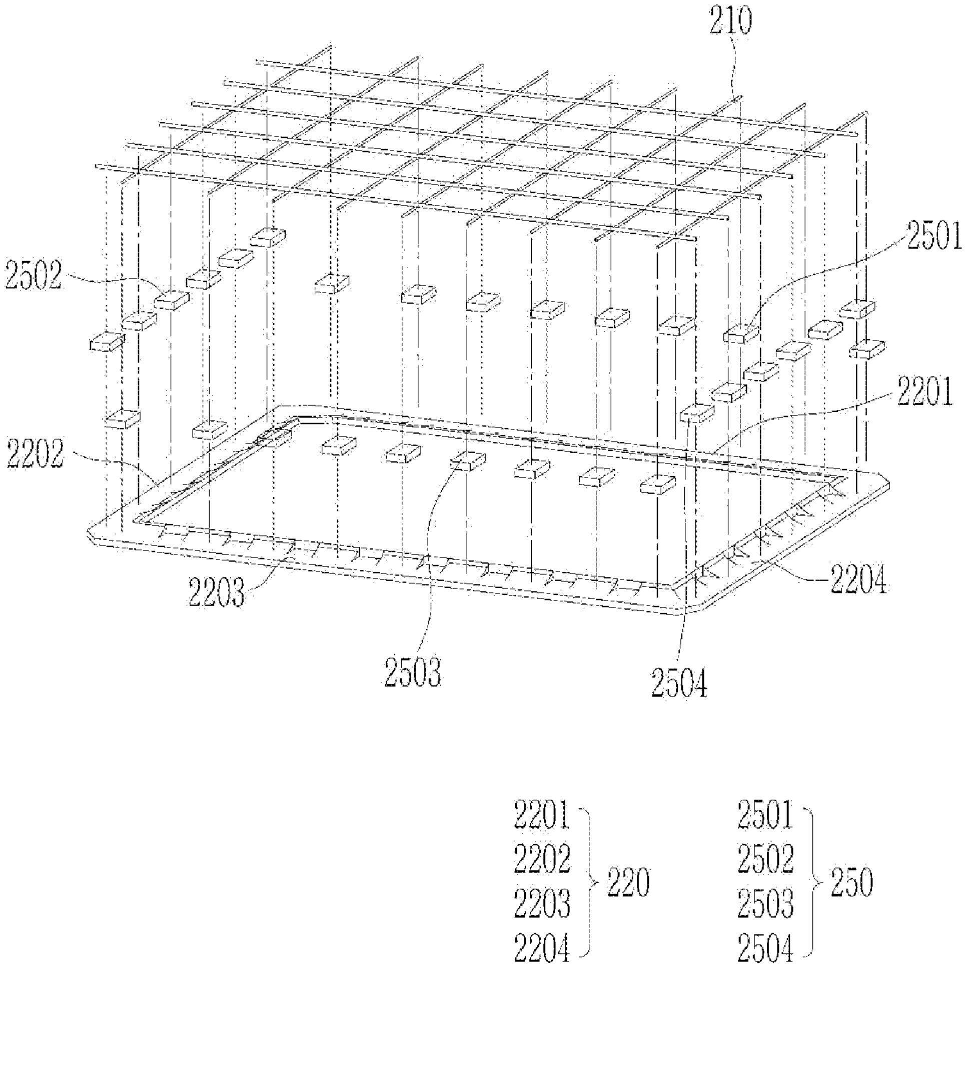
FIG. 3 is an exploded perspective view of a mask assembly of a deposition unit.

FIG. 2 is an exploded perspective view illustrating elements of a deposition unit, and FIG. 3 is an exploded perspective view of a mask assembly of a deposition unit.

FIG. 2 shows respective constituent elements configuring the deposition unit 2000, and FIG. 3 shows constituent elements of the deposition unit 2000.

The deposition unit 2000 will now be described with reference to FIG. 2.

The deposition unit 2000 may include a frame 200, a mask fixing portion 210 positioned on the frame 200, a mask 300 positioned on the mask fixing portion 210, a substrate 100 positioned on the mask 300, and a fixing plate 500 positioned on the substrate 100, and may also include a height correcting member 250 connecting the frame 200 and the mask fixing portion 210 and corresponding to the deformation of the frame 200. The height correcting member 250 may remove a gap between ends of long-side/short-side sticks of the mask fixing portion 210 and the frame 200 due to deformation of the frame 200, and may fix the mask fixing portion 210 and the frame 200. The height correcting member 250 may be provided in plural, and multiple height correcting members 250 may have different lengths. According to an embodiment, the height correcting member 250 may include a metal, and may be made of a material that is not deformed in a deposition facility.

According to an embodiment, one of the height correcting member 250 and the frame 200 may include a magnetic material, and another one of the height correcting member 250 and the frame 200 may include a metal so that they may be readily attached. According to an embodiment, the height correcting member 250 may have a variable height structure.

A gap between the frame 200 and the mask fixing portion 210 may be removed using the height correcting member 250 to reduce deposition defects such as a shadow that may be generated by a gap between the frame 200 and the mask fixing portion 210, and to increase the pixel per accuracy (PPA).

According to an embodiment, the deposition unit 2000 may have a following structure.

The frame 200 may support the substrate 100. The frame 200 may have an opening 201 so that a deposition material may be deposited on the substrate 100. An external portion 220 may be positioned along a circumference of the opening 201 of the frame 200. As shown in FIG. 2, each external portions 220 may be positioned on four sides of the frame 200. The external portions 220 may include a first external portion 2201, a second external portion 2202, a third external portion 2203, and a fourth external portion 2204. The first external portion 2201, the second external portion 2202, the third external portion 2203, and the fourth external portion 2204 may be connected to each other.

An edge of the substrate 100 may be supported by the external portion 220. The external portion 220 may include a first surface on which the substrate 100 is positioned, and a second surface that is an opposite surface of the first surface and on which the substrate 100 is not positioned. The height correcting member 250 may be attached to the surface on which the substrate 100 is positioned, and the mask fixing portion 210 and the mask 300 may be positioned between the height correcting member 250 and the substrate 100.

The mask fixing portion 210 may, as shown in FIG. 2, have a lattice shape configured with a long-side stick and a short-side stick. The long-side stick may have a linear structure extending in a long-side direction, and the short-side stick may have a linear structure extending in a short-side direction that is perpendicular to the long-side direction. The long-side stick may be separated from the short-side stick. The mask 300 may be positioned on the lattice shape configured with the long-side stick and the short-side stick.

The mask 300 may be a fine metal mask (FMM). According to an embodiment, the mask 300 may include multiple masks extending in a direction (e.g., the short-side direction), unlike what is described in FIG. 2. A pattern to be deposited on the substrate 100 may be formed on the mask 300. Therefore, the deposition material sprayed by the deposition source 1000 may pass through the mask 300 and may be deposited on the substrate 100 in the pattern.

The substrate 100 may be positioned on a side of the mask 300, and the substrate 100 may be fixed to the fixing plate 500. The fixing plate 500 may be positioned on a rear side of the substrate 100, for example, a side on which the deposition is not performed. The fixing plate 500 may be also referred to as an electrostatic chuck, and may stably fix the substrate 100 using static electricity.

A structure in which the frame 200, the height correcting member 250, and the mask fixing portion 210 included in the mask assembly are fastened will be described in detail with reference to FIG. 3. The mask assembly may further include a mask 300 in addition to the structure of FIG. 3.

FIG. 3 shows that each of the height correcting members 250 have a same height, but the height correcting members 250 may have different heights depending on the positions.

At least one of ends of the long-side stick and ends of the short-side stick of the mask fixing portion 210 may be connected to the height correcting member 250, and may be connected to the external portion 220 of the frame 200 by the height correcting member 250. For example, a first height correcting member 2501 and a third height correcting member 2503 may be respectively positioned on the first external portion 2201 and the third external portion 2203, and ends of the short-side sticks may be positioned on the first height correcting member 2501 and the third height correcting member 2503. A second height correcting member 2502 and a fourth height correcting member 2504 may be positioned on the second external portion 2202 and the fourth external portion 2204, and ends of the long-side sticks may be positioned on the second height correcting member 2502 and the fourth height correcting member 2504.

The height correcting members 250 may have heights according to the deformation of the respective external portions 220 of the frame 200, and may be positioned between the mask fixing portion 210 and the external portion 220 of the frame 200. Therefore, the height correcting member 250 may not be formed on a portion of the external portion 220 of the frame 200 on which the height correcting member 250 is not needed to be placed.

Regarding the heights of the height correcting members 250, deformation of the frame 200 may be predicted to form the height correcting member 250 in advance, or the deformation of the frame 200 may be measured and the height correcting members 250 may be manufactured according to the measurement.

According to the embodiment, the mask fixing portion 210 may be formed in parallel to the substrate 100 by the height correcting member 250 regardless of deformation of the frame 200. As a result, the mask 300 may be positioned on the mask fixing portion 210 parallel to the substrate 100.

Effects of the height correcting member will now be described with reference to FIG. 4 and FIG. 5.

Figure 4:
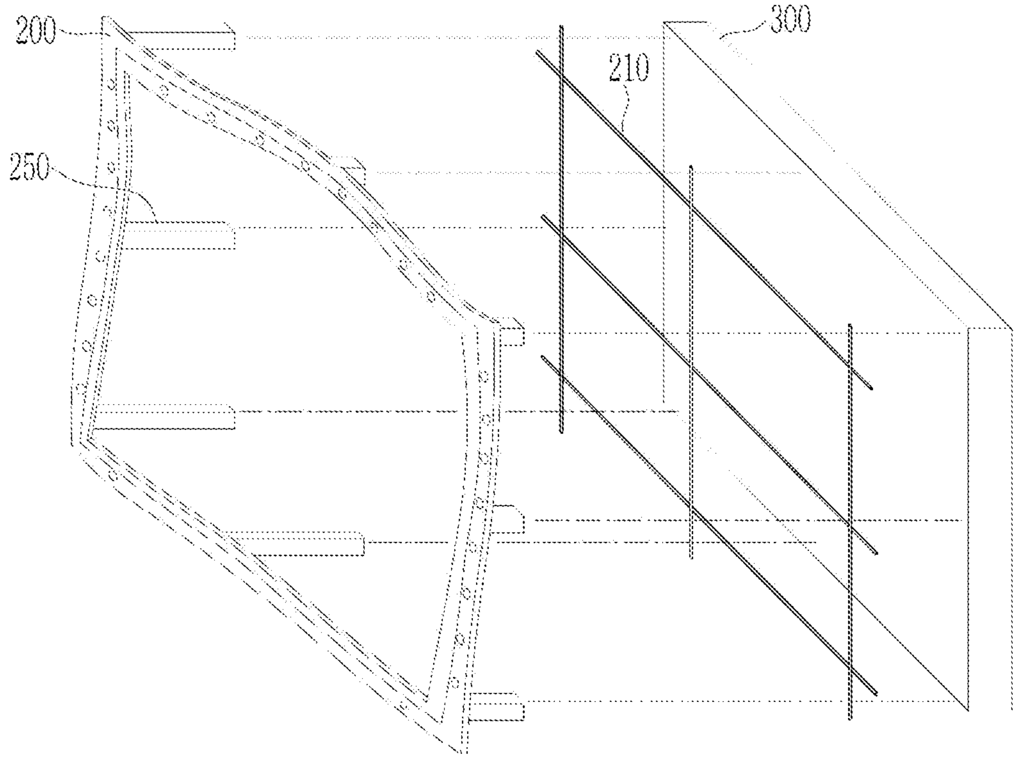
FIG. 4 is a perspective view illustrating deformation of a frame of a deposition unit and characteristics of a height correcting member.
Figure 5A:
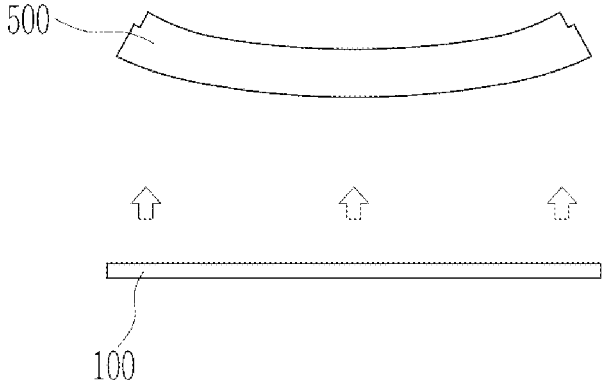
FIGS. 5A, 5B, and 5C are schematic cross-sectional views illustrating deformation of a frame of a deposition unit and characteristics of a height correcting member.
Figure 5B:
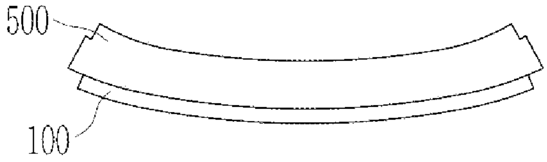
Figure 5C:
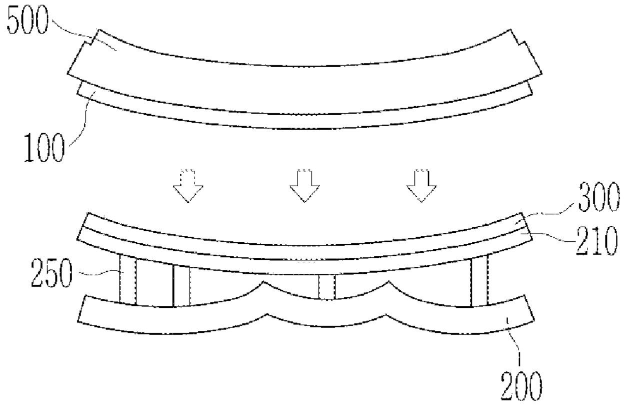

FIG. 4 is a perspective view illustrating deformation of a frame of a deposition unit and characteristics of a height correcting member, and FIGS. 5A, 5B, and 5C are schematic cross-sectional view illustrating deformation of a frame of a deposition unit and characteristics of a height correcting member.

FIG. 4 shows an embodiment of a flat mask 30 by using a flat substrate 100.

FIG. 4 shows a relatively exaggerated deformation of the frame 200.

In order to attach the mask 300 in parallel in spite of the deformation of the frame 200, the long/short-side sticks of the mask fixing portion 210 may need to extend flat. The height correcting members 250 with different heights considering deformation degrees of portions of the frame 200 on which the long/short-side sticks will be positioned may be used to fix the long/short-side sticks and the frame 200. Accordingly, the mask 300 may be arranged flat. Therefore, a gap between the mask 300 and the substrate 100 may be maintained at the time of deposition, no deposition defects may be generated, and the pixel per accuracy (PPA) may be increased.

FIG. 5 shows an embodiment in which the fixing plate 500 has a curved surface, and the substrate 100 positioned thereon also has a curved surface.

Referring to FIG. 5A, a flat 100 may be attached to a curved fixing plate 500 by an electrostatic method and may be fixed thereto so that the substrate 100 is curved. FIG. 5 B shows that the substrate 100 is fixed to the fixing plate 500.

As shown in FIG. 5 C, a mask 300, a mask fixing portion 210, a frame 200, and a height correcting member 250 may be attached to a side of the substrate 100. The frame 200 may be deformed regardless of the curved surface of the substrate 100, but the long/short-side sticks of the mask fixing portion 210 positioned thereon may have the curved surface by the height correcting member 250, and the mask 300 may also have the curved surface. As a result, the deposition defects that may be generated because of the gap between the mask 300 and the substrate 100 at the time of deposition may not be generated, and the pixel per accuracy (PPA) may be increased.

Various configuration of the height correcting member 250 will now be described with reference to FIG. 6 to FIG. 11.

The height correcting member 250 will now be described with reference to FIG. 6 and FIG. 7.

Figure 6:
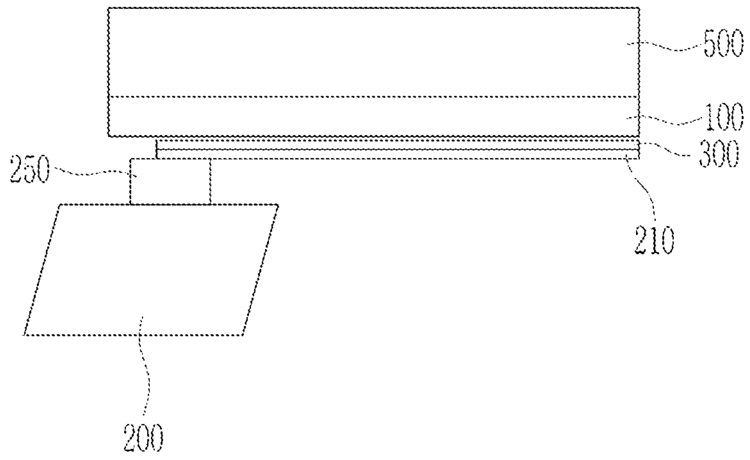
FIG. 6 is a schematic cross-sectional view of a deposition unit according to an embodiment.
Figure 7:
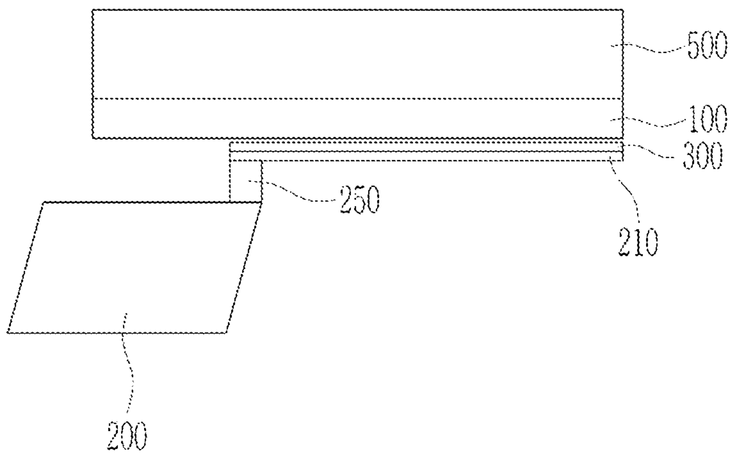
FIG. 7 is a schematic cross-sectional view of a deposition unit according to an embodiment.

FIG. 6 and FIG. 7 are each schematic cross-sectional view of a deposition unit according to an embodiment.

FIG. 6 and FIG. 7 show that the height correcting member 250 may be positioned on any portions of the frame 200, and a width of the height correcting member 250 may be wide or narrow.

For example, referring to FIG. 6 and FIG. 7, in case that a side of the frame 200 is spaced from the long/short-side stick of the mask fixing portion 210 with a gap, a height correcting member 250 with a height that corresponds to the gap may be inserted so that the frame 200 may be fixed to the long/short-side stick of the mask fixing portion 210.

Referring to FIG. 6, the height correcting member 250 may have a relatively large width in a cross-sectional view, and may be attached to a central portion of the frame 200. In the embodiment, the long/short-side sticks of the mask fixing portion 210 may be relatively long.

In another embodiment, referring to FIG. 7, the height correcting member 250 may have a relatively small width in a cross-sectional view, and may be attached to an inner end of the frame 200. In the embodiment, the long/short-side sticks of the mask fixing portion 210 may be relatively short.

The mask assemble may have different structure as shown in FIG. 6 and FIG. 7, but may have a same effect by removing a gap between the frame 200 and the long/short-side sticks of the mask fixing portion 210 using the height correcting member 250. As a result, the mask 300 may be positioned parallel to the substrate 100 regardless of deformation of the frame 200, thereby generating no defects at the time of deposition and increasing the pixel per accuracy (PPA).

An embodiment for firmly fixing the long/short-side sticks of the mask fixing portion 210 and the height correcting member 250 to the frame 200 will now be described with reference to FIG. 8 to FIG. 11.

An embodiment will now be described with reference to FIG. 8 and FIG. 9.

Figure 8:
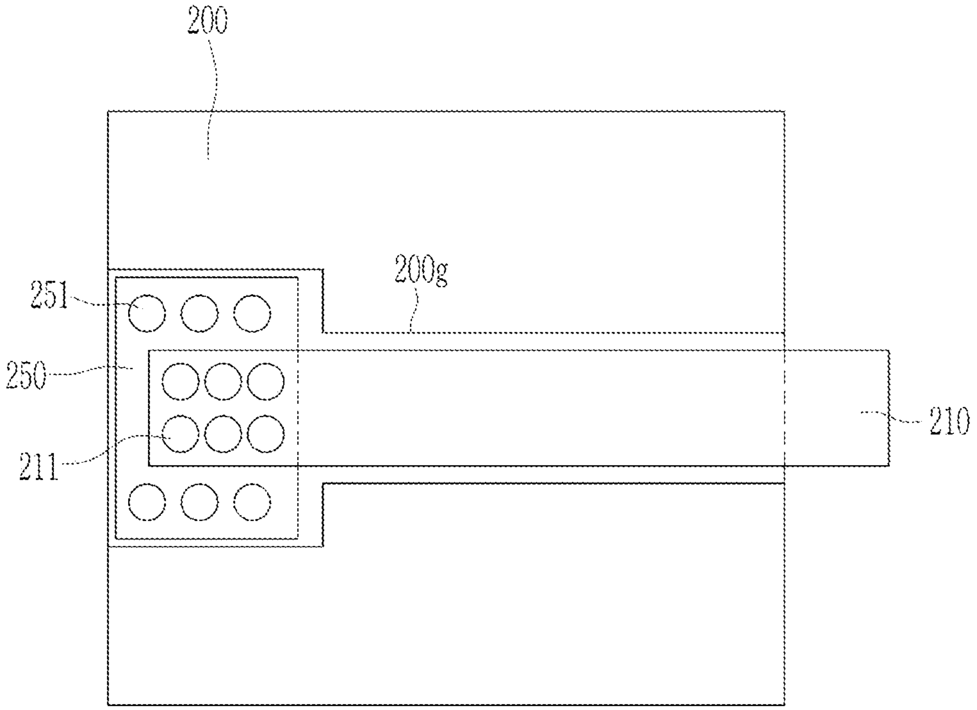
FIG. 8 is a plan view of a deposition unit according to an embodiment.
Figure 9:
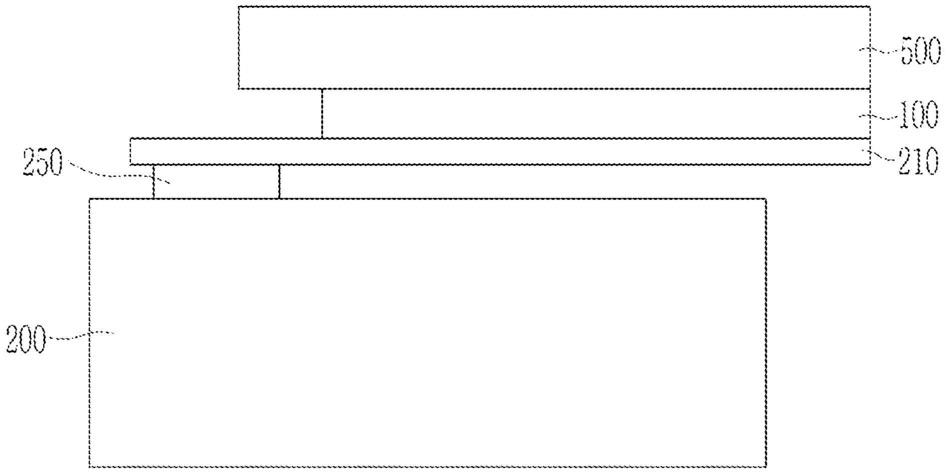
FIG. 9 is a schematic cross-sectional view of a deposition unit according to an embodiment.

FIG. 8 is a plan view of a deposition unit according to an embodiment, and FIG. 9 is a schematic cross-sectional view of a deposition unit according to an embodiment.

According to an embodiment shown in FIG. 8, a groove 200*g* may be formed on the frame 200, and the height correcting member 250 and/or the long/short-side sticks of the mask fixing portion 210 may be positioned in the groove 200*g* of the frame 200.

Referring to FIG. 8, a groove 200*g* may be formed on a portion of the frame 200 where the height correcting member 250 and the long/short-side sticks of the mask fixing portion 210 are positioned. In an embodiment, the portion where the height correcting member 250 is positioned and the portions where the long/short-side sticks of the mask fixing portion 210 are positioned may have a same depth in the groove 200*g*. In another embodiment, the portion where the height correcting member 250 is positioned and the portions where the long/short-side sticks of the mask fixing portion 210 are positioned may have different depths, or the portion of the groove where the height correcting member 250 is positioned may be deeper.

Referring to FIG. 8 and FIG. 9, a height correcting member 250 may be positioned in the groove 200*g* positioned in the external portion of the frame 200, and may be fixed to the external portion of the frame 200 by the fixing member 251. The height correcting members 250 may have different heights depending on the deformation degree of the external portion of the frame 200.

The long/short-side sticks of the mask fixing portion 210 may be positioned in the groove 200*g* of the external portion of the frame 200 on the height correcting member 250. The long/short-side sticks of the mask fixing portion 210 may be fixed to the height correcting member 250 by the fixing member 211.

Referring to FIG. 9, the frame 200 may be attached to the height correcting member 250, and the long/short-side sticks of the mask fixing portion 210 may be spaced from the frame 200 by a height. FIG. 9 is a schematic cross-sectional view of a height correcting member 250 according to the deformation degree of the frame 200. Depending on the positions, the height correcting member 250 may be omitted, or the long/short-side sticks of the mask fixing portion 210 may be positioned in the groove 200*g* of the frame 200 in case that a height correcting member 250 with low height is used.

Referring to FIG. 8 and FIG. 9, the height correcting member 250 may be positioned on an outer side of the external portion of the frame 200. For example, the groove 200*g* of the frame 200 may extend to an inside from an outside, a groove for the height correcting member 250 may be positioned on the outer side of the external portion of the frame 200, and grooves for the long/short-side sticks of the mask fixing portion 210 may be positioned on the inner side of the external portion of the frame 200.

According to an embodiment, the height correcting member 250 may be positioned on inner side of the frame 200, which will be described with reference to FIG. 10 and FIG. 11.

Figure 10:
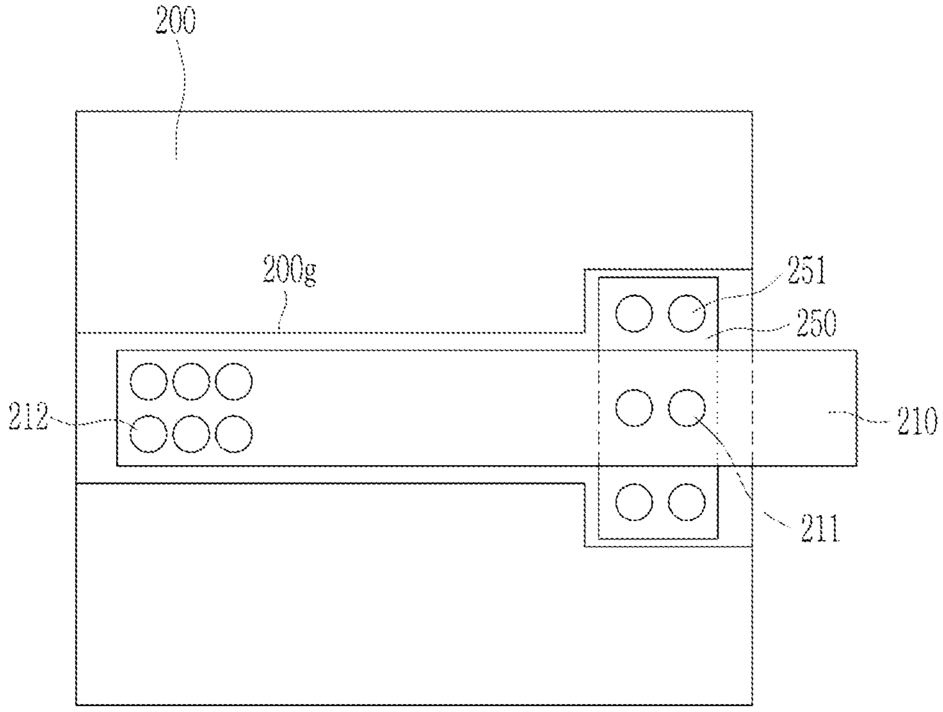
FIG. 10 is a plan view of a deposition unit according to an embodiment.
Figure 11:
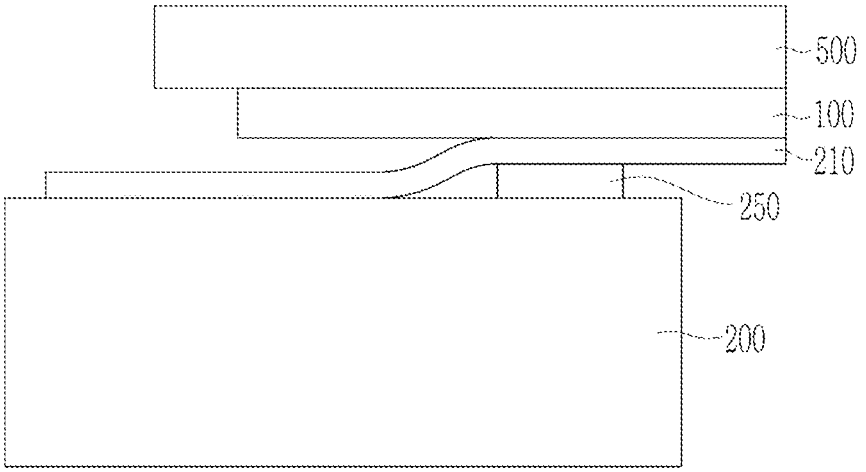
FIG. 11 is a schematic cross-sectional view of a deposition unit according to an embodiment.

FIG. 10 is a plan view of a deposition unit according to an embodiment, and FIG. 11 is a schematic cross-sectional view of a deposition unit according to an embodiment.

According to the embodiment shown in FIG. 10, a groove 200*g* may be formed on the frame 200, and the height correcting member 250 and/or the long/short-side sticks of the mask fixing portion 210 may be positioned in the groove 200*g* of the frame 200. Unlike the embodiment of FIG. 10, in the embodiment of FIG. 10, the groove 200*g* of the frame 200 may extend to the inside from the outside, a groove for the height correcting member 250 may positioned on inner portion of the frame 200, and the long/short-side sticks of the mask fixing portion 210 may be arranged in the groove 200*g* extending from outer portion to inner portion of the frame 200.

Referring to FIG. 10, a groove 200*g* may be formed on the external portion of the frame 200 where the height correcting member 250 and the long/short-side sticks of the mask fixing portion 210 are positioned. In an embodiment, a portion of the groove 200*g* where the height correcting member 250 is positioned and a portion of the groove 200*g* where the long/short-side sticks of the mask fixing portion 210 are positioned may have a same depth. In another embodiment, a portion of the groove 200*g* where the height correcting member 250 is positioned and a portion of the groove 200*g* where the long/short-side sticks of the mask fixing portion 210 are positioned may have different depths, and a portion of the groove 200*g* where the height correcting member 250 is positioned may be deeper.

Referring to FIG. 10 and FIG. 11, the height correcting member 250 may be positioned in the groove 200*g* positioned on the external portion of the frame 200 where the height correcting member 250 is positioned, and may be fixed to the external portion of the frame 200 by the fixing member 251. The height correcting members 250 may have different heights depending on the deformation degree of the external portion of the frame 200.

The long/short-side sticks of the mask fixing portion 210 may be positioned on the height correcting member 250 in the groove 200*g* of the external portion of the frame 200. The long/short-side sticks of the mask fixing portion 210 may be fixed to the height correcting member 250 by the fixing member 211. Referring to FIG. 10, the long/short-side sticks of the mask fixing portion 210 may be fixed to the external portion of the frame 200 by the fixing member 212.

Referring to FIG. 11, the long/short-side sticks of the mask fixing portion 210 may be attached to the frame 200 at the outer portion of the frame 200, and may be spaced from the frame 200 at the portion attached to the height correcting member 250. A distance between the frame 200 and the long/short-side sticks of the mask fixing portion 210 may change according to the height of the height correcting member 250, and may also change according to the deformation of the frame 200 and the position on the frame 200. Ends of the long/short-side sticks of the mask fixing portion 210 may be positioned in the groove 200*g* of the frame 200.

Further, compared to the embodiment of FIG. 8 and FIG. 9, in the embodiment described with reference to FIG. 10 and FIG. 11, the long/short-side sticks of the mask fixing portion 210 may be firmly fixed, but since the long/short-side sticks of the mask fixing portion 210 need be bent adjacent to the height correcting member 250, the long/short-side sticks may need to be made of a flexible material.

According to an embodiment, the deposition unit in the vertical deposition device may not be perpendicularly inclined but may be inclined with an angle. This will be described with reference to FIG. 12.

Figure 12:
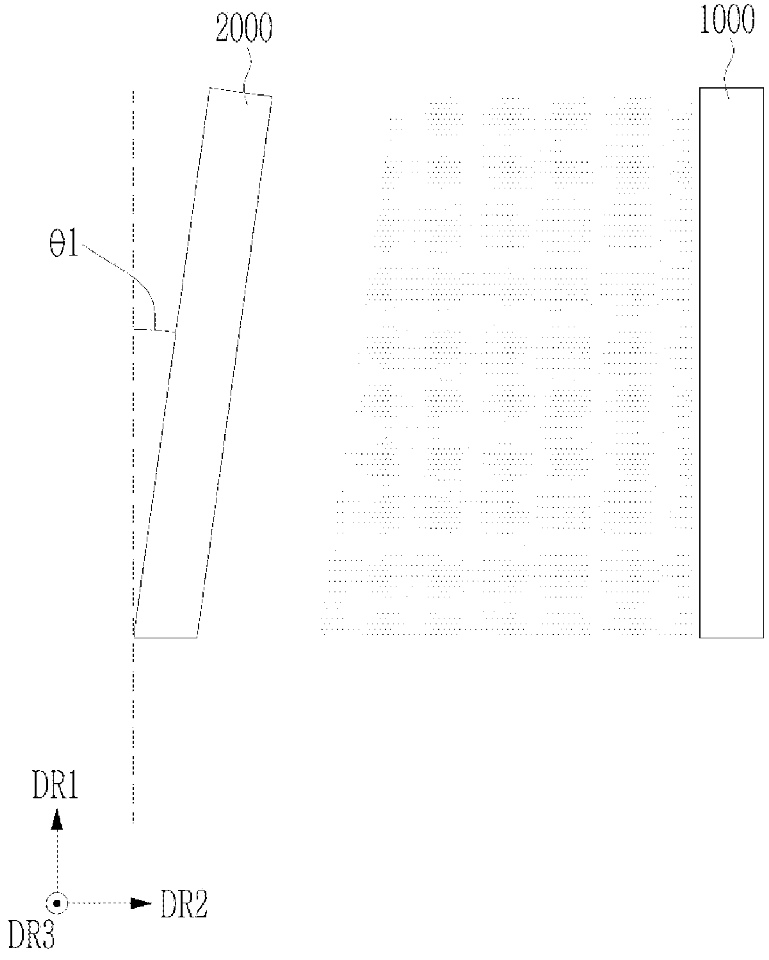
FIG. 12 is a schematic cross-sectional view illustrating an inclined degree of a deposition unit according to an embodiment.

FIG. 12 is a schematic cross-sectional view illustrating an inclined degree of a deposition unit according to an embodiment.

According to an embodiment, the deposition unit 2000 may be inclined in a direction facing the deposition source 1000 by an angle θ1. In an embodiment, the angle θ1 of the deposition unit 2000 inclined with respect to the first direction DR1 may be in a range of about 4 degrees to about 14 degrees. Within these angles, the material sprayed from the deposition source 1000 may be well provided to the deposition unit 2000. As the deposition unit 2000 is inclined by an angle, the substrate 100 positioned on the deposition unit 2000 may be stably supported during the deposition process. In case that the deposition unit 2000 is perpendicularly positioned, the substrate 100 may not be stably supported in the deposition unit 2000. In case that the inclined angle of the deposition unit 2000 is greater than about 14 degrees, the substrate 100 may be drooped by the gravity. In case that the inclined angle of the deposition unit 2000 is less than about 4 degrees, the substrate 100 may not be stably supported. For example, the angle in a range of about 4 degrees to about 14 degrees formed by the inclination of the deposition unit 2000 may prevent the drooping of the substrate, may stably support the substrate, and may efficiently perform the deposition.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A mask assembly comprising:
a mask;
a frame having an external portion surrounding an opening;
a mask fixing portion including a long-side stick and a short-side stick for fixing the mask; and
a height correction block connecting the mask fixing portion and the external portion of the frame,
wherein the height correction block extends from an upper surface of the external portion of the frame towards the mask fixing portion.

2. The mask assembly of claim 1, wherein
the height correcting member includes a first height correction block and a second height correction block, and
the first height correction block and the second height correction block have different heights.

3. The mask assembly of claim 1, wherein the height correction block includes a metal.

4. The mask assembly of claim 1, wherein
the frame has a groove on the external portion, and
the height correction block is positioned in the groove.

5. The mask assembly of claim 4, wherein the height correction block is fixed to the external portion of the frame by a first fastener.

6. The mask assembly of claim 5, wherein the height correction block and the mask fixing portion are fixed by a second fastener.

7. The mask assembly of claim 6, wherein the mask fixing portion is fixed to the external portion of the frame by the second fastener.

8. The mask assembly of claim 7, wherein the mask fixing portion is bent adjacent to the height correction block.

9. A deposition device comprising:
a deposition source providing a deposition material; and
a deposition unit including a substrate receiving the deposition material,
wherein the deposition unit includes:
a mask facing the substrate;
a frame having an external portion surrounding an opening;
a mask fixing portion including a long-side stick and a short-side stick for fixing the mask; and
a height correction block connecting an end of the mask fixing portion and the external portion of the frame,
wherein the height correction block extends from an upper surface of the external portion of the frame towards the mask fixing portion.

10. The deposition device of claim 9, wherein
the height correction block includes a first height correction block and a second height correction block, and
the first height correction block and the second height correction block have different heights.

11. The deposition device of claim 9, wherein the height correction block includes a metal.

12. The deposition device of claim 9, wherein
the frame has a groove on the external portion, and
the height correction block is positioned in the groove.

13. The deposition device of claim 12, wherein the height correction block is fixed to the external portion of the frame by a first fastener.

14. The deposition device of claim 13, wherein the height correction block is fixed to the mask fixing portion by a second fastener.

15. The deposition device of claim 14, wherein the mask fixing portion is fixed to the external portion of the frame by the second fastener.

16. The deposition device of claim 15, wherein the mask fixing portion is bent adjacent to the height correction block.

17. The deposition device of claim 9, wherein
the deposition unit further includes a fixing plate for fixing the substrate,
the mask is positioned on a side of the substrate, and
another side of the substrate is fixed to the fixing plate.

18. The deposition device of claim 9, wherein the deposition device is arranged vertically with respect to gravity.

19. The deposition device of claim 18, wherein the deposition unit is inclined with respect to gravity with an angle in a range of about 4 degrees to about 14 degrees.

20. The deposition device of claim 18, wherein the deposition source includes:
a vaporizer vaporizing the deposition material;
a pipe connected to the vaporizer; and
a nozzle extending vertically with respect to gravity.

* * * * *